United States Patent
Sano (10) Patent No.: US 6,211,454 B1
(45) Date of Patent: Apr. 3, 2001

(54) PHOTOVOLTAIC ELEMENT

(75) Inventor: Masafumi Sano, Kyoto (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/235,334

(22) Filed: Jan. 22, 1999

(30) Foreign Application Priority Data

Jan. 23, 1998 (JP) .................................................. 10-010870

(51) Int. Cl.$^7$ .................................................. H01L 31/00

(52) U.S. Cl. .......................................... 136/258; 136/255

(58) Field of Search ..................................... 136/258, 255

(56) References Cited

U.S. PATENT DOCUMENTS

| | | | |
|---|---|---|---|
| 2,949,498 | 8/1960 | Jackson | .................................... 136/89 |
| 4,775,425 | * 10/1988 | Guha et al. | .......................... 136/249 |
| 5,977,476 | * 11/1999 | Guha et al. | .......................... 136/249 |

OTHER PUBLICATIONS

Japanese Journal of Applied Physics, vol 36, No. 5A, pp. L569–L572, Kenji Yamamoto, et al., "Optical Confinement Effect for Below 5μm Thin Film Poly–Si Solar Cell on Glass Substrate", May 1, 1997.

Eleventh E.C. Photovoltaic Solar Energy Conference, Montreux, Switzerland, pp. 88–91, K. Miyachi, et al., "Fabrication of Single Pin Type Solar Cells with a High Conversion Efficiency of 13.0%", Oct. 12–16, 1992.

* cited by examiner

Primary Examiner—Mark Chapman (57) ABSTRACT

A photovoltaic element is provided which comprises a support substrate, a first transparent conductive layer formed on the support substrate, a semiconductor layer stacked in the nip-type thereon, and a second transparent conductive layer formed thereon, wherein the n-type semiconductor layer of the nip-type stacked semiconductor layer comprises an amorphous semiconductor layer and a microcrystalline semiconductor layer of a microcrystalline volume percentage of 3–75%, and wherein the i-type semiconductor layer thereof comprises a microcrystalline semiconductor layer. This provides a photovoltaic element with a high photoelectric conversion efficiency at a low cost.

6 Claims, 7 Drawing Sheets

PHOTOVOLTAIC ELEMENT

BACKGROUND OF THE INVENTION

1. Field of the Invention

The present invention relates to photovoltaic elements such as solar cells and sensors, particularly to a photovoltaic element comprising an nip-type silicon semiconductor layer containing an i-type microcrystalline semiconductor layer.

2. Related Background Art

Photovoltaic elements, which are photoelectric conversion elements for converting solar insolation to electric energy, are used widely as a small power source for consumer goods such as electronic calculators, wrist watches, and the like, and are considered to be promising as an alternative power source to chemical fuels such as petroleum and coal.

The photovoltaic element utilizes photoelectromotive force of a pn junction of a semiconductor. The semiconductor such as silicon is allowed to absorb sunlight to produce photocarriers of electrons and holes, and the photocarriers are drifted by an internal electric field of the pn junction and are unmoved. A photovoltaic element can be produced in a in a manner similar to an usual semiconductor manufacturing process. Specifically, a p-type or n-type valency-controlled single crystal silicon is made by a crystal growth process such as the CZ technique, and the single crystal is sliced into silicon wafers of about 300 μm thick. Further, on a surface of the wafer, a layer of a conductivity type other than that of the wafer is formed by an appropriate means such as diffusion of a valency controlling agent to produce a pn junction.

Incidentally, from the standpoint of reliability and conversion efficiency, single crystal silicon is now used mainly for practical photovoltaic elements. However, the production cost thereof is high since the semiconductor process is employed for the production. The single crystal silicon photovoltaic element has further problems in that the single crystal silicon is an indirect transition semiconductor and has a small optical absorption coefficient, whereby at least a thickness of 50 μm of the single crystal photovoltaic element is necessary for absorption of incident sunlight, and that the single crystal silicon has a bandgap of about 1.1 eV which is narrower than the value of 1.5 eV suitable for the photovoltaic element, whereby the short wavelength components of the light can not be utilized effectively.

On the other hand, a photovoltaic element employing polycrystal silicon is disclosed which has a surface texture structure, formed at a process temperature lower than 550° C., and exhibits excellent characteristics with a thickness of 5 μm or less (Keiji Yamomoto, Akihiko Nakajima, et al., "Optical Confinement Effect for below 5 μm Thin Film Poly-Si Solar Cell on Glass Substrate", Jpn. J. Appl. Phys., Vol. 36 (1997), pp. L569–L572). However this photovoltaic element has not been practically used due to a relatively high process temperature and a low process speed.

Further, since the single crystal and the polycrystal materials are crystalline, it is very difficult to produce a wafer or polycrystal layer with a large area. Moreover, when the photovoltaic element employing such a material is used outdoors, an expensive mounting equipment is required in order to protect the element from mechanical damage caused by various weather conditions. Therefore, there is a problem in that the production cost for unit power generation is high in comparison with conventional power generation methods.

Therefore, reducing cost and expanding the area are an important technical subject for practical use of the photovoltaic elements in power generation. Many investigations have been made, and low-cost materials and materials of higher conversion efficiency have been searched. Such materials for the photovoltaic element include amorphous semiconductors of the tetrahedral type such as amorphous silicon, amorphous silicon germanium, and amorphous silicon carbide; compound semiconductors of Groups II–VI such as CdS, $Cu_2S$, etc. and those of Groups III–V such as GaAs, GaAlAs, etc., or the like. Especially, thin film photovoltaic elements employing an amorphous semiconductor as the photoelectromotive force generation layer are considered to be promising because of their advantages over the single crystal photovoltaic elements such as a possibility of producing films of a larger area, attainability of a smaller film thickness, ability to be deposited on any substrate material, and so on.

However, when the photovoltaic element employing the amorphous semiconductor is to be used as a power supply element, there still remains a problem that photoelectric conversion efficiency and reliability need to be further improved.

As the means for improving the photoelectric conversion efficiency of the photovoltaic element employing the amorphous semiconductor, there is carried out, for example, a process of narrowing the bandgap to increase the sensitivity to the longer wavelength light. Specifically, since the amorphous silicon is not capable of absorbing and effectively utilizing longer wavelength light of 700 nm or more due to its bandgap of about 1.7 eV, materials which have a narrower bandgap and are sensitive to the longer wavelength light. As such a material, there is included amorphous silicon germanium the bandgap of which can easily be varied arbitrarily in the range from 1.3 eV to 1.7 eV by changing the ratio of the silicon source gas to the germanium source gas during the film formation.

Further, as another method for improving the photoelectric conversion efficiency of the photovoltaic element, U.S. Pat. No. 2,949,498 discloses employing a stack cell in which a plurality of photovoltaic elements of the unit element structure are stacked. The stack cell employs a pn junction semiconductor. The concept is common to amorphous materials and crystalline materials and is to improve the power generation efficiency by efficiently absorbing the sunlight spectrum by photovoltaic elements of different bandgaps to increase $V_{oc}$.

The stack cell is to improve the conversion efficiency by stacking elements of different bandgaps and thus efficiently absorbing respective fractions of the sunbeam spectrum, and is designed such that the bandgap of the so-called bottom layer positioned at the side opposite to the light incidence side of the stack cell is narrower than the bandgap of the so-called top layer positioned at the light incidence side and over the bottom layer. This enabled it to sufficiently absorb the spectra of the sunbeam and improve the photoelectric conversion efficiency (K. Miyachi et al., Proc. 11th. E. C. Photovoltaic Solar Energy Conf. Montreux, Switzerland, 88, 1992; and K. Nomoto et al., "a-Si Alloy Three-Stacked Solar Cells with High Stabilized-Efficiency, 27th Photovoltaic Science and Engineering Conf., Nagoya, 275, 1993).

However, the photovoltaic element employing the amorphous semiconductor for all the i-type semiconductor layers has encountered a problem of lowering the conversion efficiency by light irradiation, namely the so-called photodeterioration, and the reduction thereof has been limited. This is because the film of the amorphous silicon or the amorphous silicon germanium is deteriorated by light irradiation to lower the movability of the carriers. Such phenomenon is not observed in crystal semiconductor and is inherent to the amorphous semiconductor. Therefore, the amorphous semiconductor is less reliable and is not suitable for practical use for power generation.

Recently, attention has been focused on i-type microcrystalline silicon semiconductors produced by the plasma CVD process in view of smaller film thickness necessary for obtaining a sufficient photocurrent and of less photodeterioration and several reports have been presented thereon: A. Shah, H. Keppner et al., "INTRINSIC MICROCRYSTALLINE SILICON ($\mu$c-Si:H), A PROMISING NEW THIN FILM SOLAR CELL MATERIAL", 1994 IEEE First WCPEC, pp.409–412, Dec. 5–9, 1994, Hawaii; and A. Shah, H. Keppner et al., "The "Micromorph" Solar Cell, Extending a-Si:H Technology Towards Thin Film Crystalline Silicon, 25th IEEE PV Specialists Conference, Washington, May 13–17, 1996.

However, in any of the above reports, the deposition rate of the microcrystalline layer is small, which is an obstacle to practical use.

SUMMARY OF THE INVENTION

An object of the present invention is to provide a photovoltaic element employing a microcrystalline semiconductor layer, which overcomes the above mentioned problems of the prior art and can be produced with a smaller thickness at a higher deposition rate, being useful for power generation, functioning with high reliability at high conversion efficiency, and being produced at a lower cost.

According to the present invention, there is provided a photovoltaic element comprising a conductive substrate having on a support substrate at least one layer of a first transparent electroconductive (hereinafter, simply referred to as "conductive") layer; an n-type semiconductor layer, an i-type semiconductor layer, and a p-type semiconductor layer provided on the conductive substrate in the order mentioned; and a second transparent conductive layer further provided thereon, wherein the n-type semiconductor layer comprises at least two layers of an n-type amorphous semiconductor layer and an n-type microcrystalline semiconductor layer of a microcrystalline volume percentage of 3–75%, and wherein the i-type semiconductor layer comprises an i-type microcrystalline semiconductor layer.

The first transparent conductive layer preferably has a surface at the semiconductor layer side thereof such that where f represents the distance from the support substrate surface to the layer surface, within the range of 20 to 100 nm of the sampling length dx, the distribution of inclinations, arctan (df/dx) of the layer surface is a normal distribution with 0° being the center, and that the kurtosis is within the range of −1.2 to 0.5 and the standard deviation is 15° to 55°. Herein, the support substrate surface is not the actual support substrate surface (sometimes uneven), but signifies a phantom plane obtained by disregarding the unevenness of the actual support substrate surface.

Further, the second transparent conductive layer is preferably formed by sputtering using a sputtering gas containing a trace amount of oxygen.

Moreover, the n-type amorphous semiconductor layer preferably has a thickness of 50–1000 Å.

Further, the n-type microcrystalline semiconductor layer preferably has a thickness of 50–1000 Å.

Moreover, the i-type microcrystalline semiconductor layer preferably has a thickness of 0.5–3 $\mu$m.

DESCRIPTION OF THE PREFERRED EMBODIMENTS

In the present invention, the n-type microcrystalline semiconductor layer serves as a low-resistance n-type semiconductor layer and also as a nucleation layer for the i-type microcrystalline layer to be formed thereon, being capable of growing the i-type microcrystalline semiconductor layer even in a thin film state with appropriate grain diameters, providing a structure of a relatively high crystallinity with less amorphous region, and attaining a practically usable high speed deposition rate with little photodeterioration. Therefore, the high speed film formation which has been difficult hitherto can be accomplished to reduce substantially the production cost.

Further, providing the n-type amorphous semiconductor layer on the first transparent conductive layer can improve the adhesion between the transparent conductive layer and the semiconductor layer, prevent the transparent conductive layer from being reduced by a hydrogen plasma or the like, and facilitate the deposition of the n-type microcrystalline semiconductor layer with good reproducibility and the formation of n-type microcrystals of relatively uniform crystal grain diameters with less abnormal crystal growth.

Moreover, the control of distribution of arctan (df/dx) as mentioned above increases the light reflectivity of the back surface and can make the thickness of the i-type microcrystalline semiconductor layer in the nip-type semiconductor layer far smaller than conventionally preferred, and can prevent an increase of localized states in the i-type semiconductor layer by light irradiation and retard the photodeterioration of the photovoltaic element itself.

The formation of the second transparent conductive layer by sputtering using a sputtering gas containing a trace mount of oxygen can reduce interface states between the i-type microcrystalline layer and the p-type semiconductor layer positioned thereon in the nip-type semiconductor layer, and improve the grain boundaries in the i-type layer, whereby a high photoelectric conversion efficiency can b e achieved with retarded photodeterioration.

The control of the thickness of the n-type amorphous semiconductor layer within the range of 50–1000 Å can facilitate the control of the microcrystalline volume percentage of the n-type microcrystallineline semiconductor layer, and retard the damage of the first transparent conductive layer caused by a plasma to improve the adhesion of the layers and to enable formation of the element of a large area with a high photoelectric conversion efficiency.

The control of the thickness of the n-type microcrystalline semiconductor layer within the range of 50–1000 Å allows the n-type microcrystalline semiconductor layer to function well as a low-resistivity n-type semiconductor layer and facilitates high-speed film formation and control of the crystal grain diameter and crystallization percentage of the i-type microcrystalline semiconductor layer to achieve a high photoelectric conversion efficiency with little photodeterioration.

The control of the thickness of the i-type microcrystalline semiconductor layer within the range of 0.5–3 μm, that is, making the thickness of the i-type microcrystalline semiconductor layer far smaller than conventionally preferred, retards the increase of the localized states in the i-type layer by light irradiation, and further retards the photodeterioration.

The photoelectric element of the present invention is described below in more detail by reference to preferred embodiments without limiting the present invention.

Figure 1:
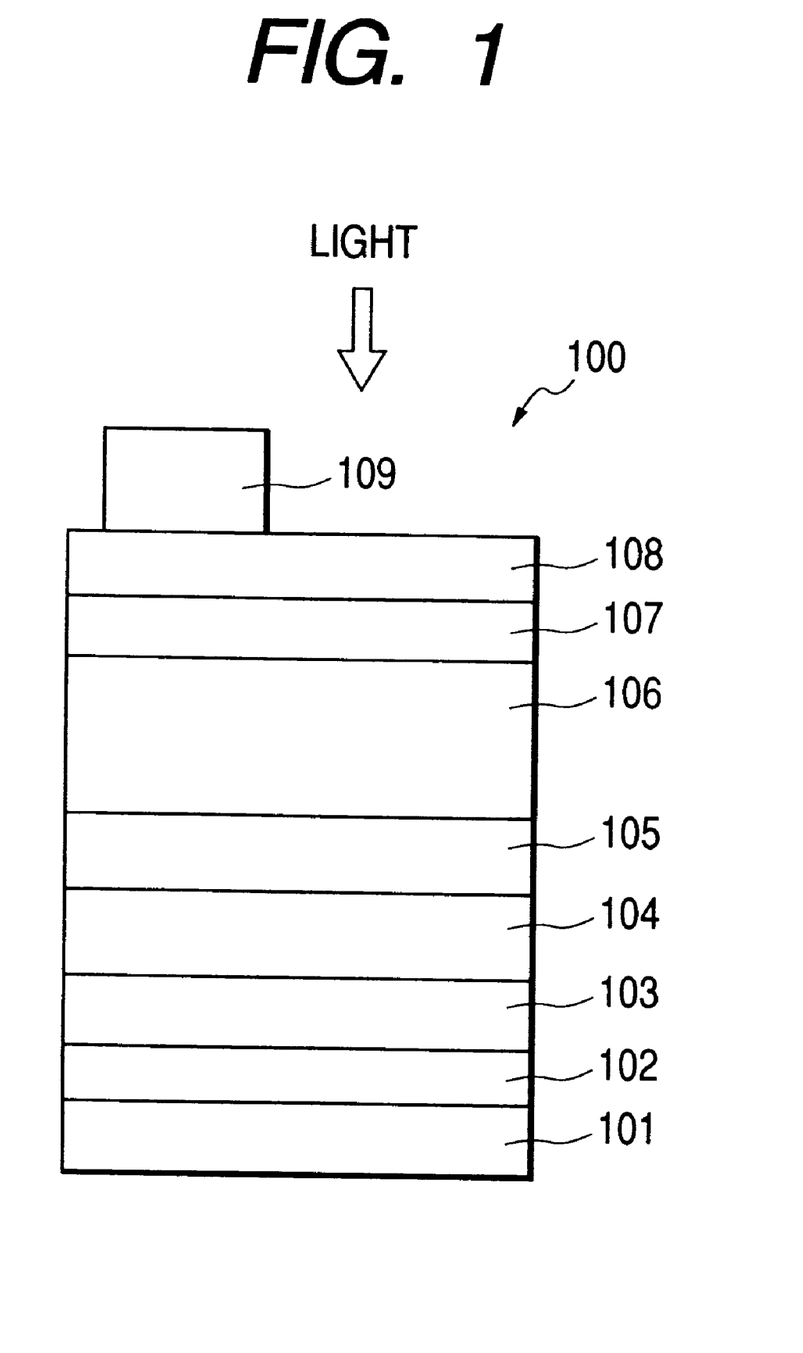
FIG. 1 is a schematic sectional view showing an embodiment of the photovoltaic element of the present invention.

FIG. 1 is a schematic sectional view that shows an embodiment of the photovoltaic element of the present invention. In the figure, 100 is a photovoltaic element, 101 a support substrate, 103 a first transparent conductive layer, 104 an n-type amorphous semiconductor layer, 105 an n-type microcrystalline semiconductor layer, 106 an i-type microcrystalline semiconductor layer, 107 a p-type semiconductor layer, 108 a second transparent conductive layer, and 109 a collector electrode. Further, between the support substrate 101 and the first transparent conductive layer 103, a back surface reflecting layer 102 may be provided as the occasion demands.

(Support Substrate)

Because the semiconductor layers 104–107 are a thin film having a maximum thickness of about 3 μm, may be deposited on an appropriate support substrate. Such a support substrate 101 may be single-crystal or non-single-crystal, and may be conductive or electrically insulating. Further, the support substrate 101 may be either transparent or non-transparent, and is preferably with strength not to undergo a significant deformation or distortion. Specifically, there are included thin plates of a metal such as Fe, Ni, Cr, Al, Mo, Au, Nb, Ta, V, Ti, Pt, Pb, etc. or alloys thereof (brass, stainless steel, etc.) and composites thereof; films and sheets of a heat-resistant synthetic resin such as polyester, polyethylene, polycarbonate, cellulose acetate, polypropylene, polyvinyl chloride, polyvinylidene chloride, polystyrene, polyamide, polyimide, epoxy resins, etc.; composites of the synthetic resin with glass fiber, carbon fiber, boron fiber, metal fiber, or the like; materials obtained by surface coating the aforementioned thin metal plates or resin sheets with a different metal thin film and/or an insulating thin film such as $SiO_2$, $Si_3N_4$, $Al_2O_3$, AlN, etc. by sputtering, vapor deposition, plating, or the like; and glass and ceramics.

In the present invention, when the support substrate 101 is of a conductive material such as a metal, it may be allowed to serve also as an electrode for taking out the electric current. On the other hand, when the support substrate 101 is of an electrically insulating material such as a synthetic resin, it is preferable to form a current-taking electrode by providing the surface on the side for deposited film formation with a simple metal, metal alloy, or a transparent conductive oxide (TCO) such as Al, Ag, Pt, Au, Ni, Ti, Mo, W, Fe, V, Cr, Cu, stainless steel, brass, nichrome, $SnO_2$, $In_2O_3$, ZnO, and ITO (indium tin oxide) by plating, vapor deposition, sputtering, or the like. This electrode can serve also as a back surface reflecting layer or the first transparent conductive layer as described below.

Further, even when the support substrate 101 is of a conductive material such as a metal, a layer of a metal other than the material of the support substrate may be provided on the deposition film formation side of the support substrate 101 for the purpose of improving the reflectivity for long wavelength light at the substrate surface or preventing mutual diffusion of constituting elements between the substrate material and the deposited film. This metal layer can serve also as the back surface reflecting layer. Further, when the support substrate 101 is relatively transparent, and when the photovoltaic element is such that a layer constitution that the light is introduced from the side of the support substrate 101, it is preferred that a transparent conductive oxide or a thin metal film is deposited preliminarily. This conductive thin film can serve as the first transparent conductive layer.

The surface of the support substrate 101 may be smooth or finely uneven. When the surface is finely uneven, the uneven shape is a spherical, conical, pyramidal or the like shape, and the maximum height ($R_{max}$) is preferably 0.05–2 μm. Thereby, the light reflection on the surface is irregular reflection, which increases the optical path length of the reflection light on the surface. The support substrate may be in a shape of a plate, a long belt, a cylinder, or the like having a smooth or uneven surface depending on the uses. The thickness is determined suitably so as to form a desired photovoltaic element. In the case where the formed photovoltaic element is required to be flexible, or where the light incidence is effected from the substrate side, the substrate may be made as thin as possible as long as the functions for the substrate is exhibited satisfactorily. Usually, the thickness of the substrate is 10 μm or more in view of the production, handling, mechanical strength, and so on.

(Back Surface Reflecting Layer)

The back surface reflecting layer serves as a light reflection layer to reflect the light not absorbed in the semiconductor layer back to the semiconductor layer. The back surface reflecting layer employed in the present invention, which may serve as a back surface electrode, is provided at the back surface of the semiconductor layer relative to the light incidence direction. Therefore, it is placed at the position 102 in FIG. 1. The material for the back surface reflecting layer includes metals such as Au, Ag, Cu, Al, Ni, Fe, Cr, Mo, W, Ti, Co, Ta, Nb, and Zr, and alloys such as stainless steel. Of these, Al, Cu, Ag, and Au are particularly preferred because of the high reflectivity thereof.

Further, the back surface reflecting layer may have a smooth surface, but has preferably an uneven surface to diffuse the light. The long wavelength light not absorbed by the semiconductor layer may be diffused to increase the optical path length in the semiconductor layer, whereby the long wavelength sensitivity of the photovoltaic element is improved to increase the short circuit current to thereby improve the photoelectric conversion efficiency. For the uneven shape to diffuse the light, the maximum height difference ($R_{max}$) between the projections and depressions of the unevenness is preferably 0.2–2.0 μm.

However, in the case where the support substrate 101 serves also as the back surface electrode, the back surface reflecting layer need not be provided.

The back surface reflecting layer can be formed by vapor deposition, sputtering, plating, printing, or the like method. The formed metal or alloy film may be subjected to a treatment such as dry etching, wet etching, sand blasting, heating, or the like for forming the uneven shape for light diffusion in the back surface reflecting layer. Otherwise, the uneven shape for light diffusion can be formed by vapor depositing the aforementioned metal or alloy on a heated substrate.

(Transparent Conductive Layer)

The first transparent conductive layer 103 is provided between the back surface reflecting layer 102 and the n-type amorphous semiconductor layer 104. The first transparent conductive layer 103 not only prevents diffusion of the metal element constituting the back surface reflecting layer 102 into the n-type amorphous semiconductor layer 104, but also serves to prevent, with its certain resistivity, short-circuit between the back surface reflecting layer 102 (sometimes serving as an electrode) and the second transparent conductive layer 108 opposing to each other with the semiconductor layer therebetween caused by defects of the semiconductor layer such as pinholes, and to generate a multiple interference by thin films to confine the incident light within the photovoltaic element.

Further, the first transparent conductive layer 103 may have a smooth surface, but has preferably an uneven surface to diffuse the light. The long wavelength light not absorbed by the semiconductor layer may be diffused to increase the optical path length in the semiconductor layer, whereby the long wavelength sensitivity of the photovoltaic element is improved to increase the short circuit current to thereby improve the photoelectric conversion efficiency. For the uneven shape to diffuse the light, the maximum height difference ($R_{max}$) between the projections and depressions of the unevenness is preferably 0.2–2.0 μm.

In the present invention, the first transparent conductive layer 103 preferably has a surface at the semiconductor layer side thereof such that where f represents the distance from the support substrate surface to the layer surface, within the range of 20 to 100 nm of the sampling length dx, the distribution of inclinations, arctan (df/dx) of the layer surface is a normal distribution with 0° being the center, and that the kurtosis is within the range of −1.2 to 0.5 and the standard deviation is 15° to 55°.

Figure 2:
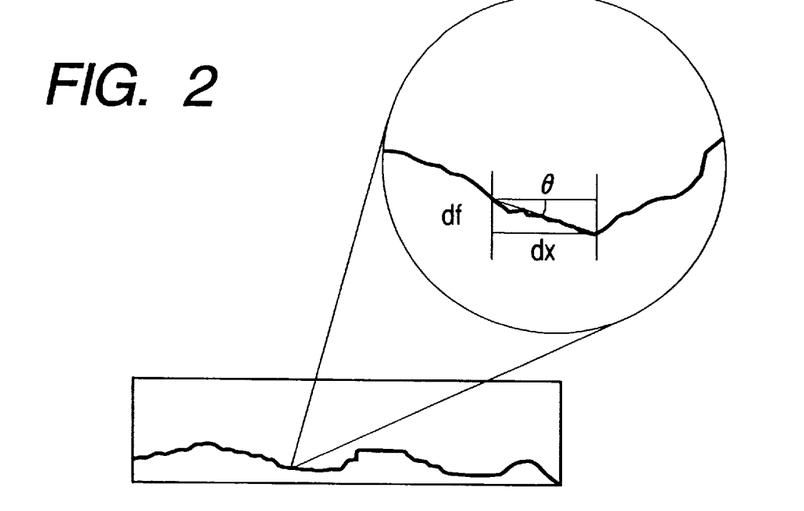
FIG. 2 is a scheme showing the method of evaluating inclinations of the surface shape of the first transparent conductive layer in the present invention.

FIG. 2 is a schematic view illustrating the method of observing the section of the surface of the first transparent conductive layer of the photovoltaic element of the present invention with a probe microscope and determining from the observation data to the gradient df/dx, the inclination, arctan (df/dx) of the surface with an arbitrary sampling length.

With a smaller range of the sampling length, inclinations of unevenness not contributing to increase of short circuit photocurrent may be detected. On the contrary, with a larger range of the sampling length, the sampling length approaches the pitches of the unevenness, so that it is not possible to correctly measure the unevenness corresponding to the wavelength contributing to the increase of the light absorption. Therefore, the sampling length is preferably in the range of about ⅓ to 1/10 of the wavelength of light to be converted to electrical signals by the photovoltaic element. When it is intended to absorb the light within the range of ultraviolet, visible, and near-infrared light, the sampling length is preferably 20 to 100 nm.

It has been found preferable that the distribution of the inclinations measured with the above mentioned sampling length is a normal distribution with the center at 0° and has no deviation. The deviation thereof from the normal distribution, kurtosis, is represented by the following equation:

$$\text{Kurtosis} = \left\{ \frac{n(n+1)}{(n-1)(n-2)(n-3)} \sum \left( \frac{(x_1 - \bar{x})}{s} \right) \right\} - \frac{3(n-1)^2}{(n-2)(n-3)}$$

where s represents the standard deviation.

A positive value of the kurtosis shows that the is relatively sharp, whereas negative value thereof shows that the distribution is relatively flat. In the present invention, it is preferred that the distribution is a normal distribution with the aforementioned kurtosis being within the range of −1.2 to 0.5, and that the standard deviation is 15° to 55°. With the standard deviation less than 15°, the i-type microcrystalline semiconductor layer needs to be made relatively thicker. With the standard deviation larger than 55°, local stress in the semiconductor layer may be generated at sharp projection portions, thus tending to form defect portions, and voids due to no deposition of the semiconductor in depression portions can easily be formed to increase leakage current of the photovoltaic element, thus lowering the yield of production of the photovoltaic element.

The first transparent conductive layer can be formed by vapor deposition, sputtering, plating, printing, or the like method. Further, in order to form the uneven shape for light diffusion in the first transparent conductive layer, the formed film for the transparent conductive layer may be subjected to a treatment of dry etching, wet etching, sand blasting, heating, or the like. Otherwise, the uneven shape for light diffusion can be formed by depositing the transparent conductive layer on a heated substrate. Wet etching can be conducted effectively by use of an acid or an alkali. At this time, stable control of the uneven shape is difficult. When performing such control, the liquid temperature of the etchant and the immersing time are important factors. The acid used at this time includes formic acid, acetic acid, hydrochloric acid, nitric acid, or the like. The alkali includes potassium hydroxide, sodium hydroxide, aluminum hydroxide, or the like. Salts may be used therefor, including iron chloride, aluminum chloride, aluminum sulfate, or the like. Use of a mixture solution containing acetic acid and aluminum sulfate enables relatively stable control of the uneven shape. At this time, the liquid temperature, though depending on the concentration of the etchant, is preferably a low temperature for attaining good controllability.

(N-type Amorphous Semiconductor Layer, n-Type Microcrystalline Semiconductor Layer, and p-Type Semiconductor Layer)

The n-type amorphous semiconductor layer 104, n-type microcrystalline semiconductor layer 105, and p-type semiconductor layer 107 are important layers that affect the characteristics of the photovoltaic element of the present invention. In the present invention, the semiconductor layers are formed from a hydrogen-containing silicon type semiconductor.

The amorphous material (hereinafter "amorphous" is abbreviated to "a-") and the microcrystalline material (hereinafter "microcrystalline" is abbreviated to "μc-") used for the p-type layer and the n-type layer include materials, such as a-Si:H, a-Si:HX, a-SiC:H, a-SiC:HX, a-SiGe:H, a-SiGeC:H, a-SiO:H, a-SiN:H, a-SiON:HX, a-SiOCN:HX, μc-Si:H, μc-SiC:H, μc-Si:HX, μc-SiC:HX, μc-SiGe:H, μc-SiO:H, μc-SiGeC:H, μc-SiN:H, μc-SiON:HX, μc-SiOCN:HX, and so on, each added with a p-type valency controlling agent (Group III atoms: B, Al, Ga, In, and Tl) or an n-type valency controlling agent (Group V atoms: P, As, Sb, and Bi) at a high concentration. The polycrystal materials (hereinafter "polycrystal" is abbreviated to "poly-") for the n-type microcrystalline semiconductor layer and the p-type semiconductor layer include materials such as poly-Si:H, poly-Si:HX, poly-SiC:H, poly-SiC:HX, poly-SiGe:H, poly-Si, poly-SiC, poly-SiGe, and so on, each added with a p-type valency controlling agent (Group III elements: B, Al, Ga, In, and Tl) or an n-type valency controlling agent (Group V atoms: P, As, Sb, and Bi) at a high concentration. The symbol X above indicates a halogen atom.

In particular, a crystalline semiconductor layer that absorbs less light or an amorphous semiconductor layer that has a broad bandgap is suitable for the p-type semiconductor layer positioned at the light incidence side.

The added amount of the Group III atoms in the p-type layer, or of the Group V atoms in the n-type layer is preferably 0.1 to 50 atomic %.

The hydrogen atoms (H and D) or halogen atoms contained in the p-type layer or the n-type layer compensate the dangling bonds of the p-type layer or the n-type layer to improve the doping efficiency of the p-type layer or the n-type layer. The addition amount of the hydrogen atoms or the halogen atoms into the p-type layer or the n-type layer is preferably 0.1 to 40 atomic %. In particular, when added to the n-type microcrystalline semiconductor layer having crystallinity or to the p-type semiconductor layer, the addition amount of the hydrogen atoms or the halogen atoms is preferably 0.1 to 8 atomic %. Further, the preferred distribution pattern is such that the content (concentration) of the hydrogen atoms and/or the halogen atoms is higher at the side of the interface of the p-type layer/i-type layer and at the side of the interface of the n-type layer/i-type layer than at the other regions. The concentrations of the hydrogen atoms and/or the halogen atoms in the vicinity of the interfaces are preferably 1.05 to 2 times higher than the concentrations in the bulk. The above mentioned higher concentrations of the hydrogen atoms and/or the halogen atoms in the vicinity of the interfaces of the p-type layer/i-type layer and of the n-type layer/i-type layer can reduce the defect states and the mechanical strain in the vicinity of the interfaces to increase the photoelectromotive force and the photocurrent of the photovoltaic element of the present invention.

In the present invention, the n-type microcrystalline semiconductor layer 105 has a microcrystalline volume percentage of not less than 3% and not more than 75%. This results in that even when the i-type microcrystalline semiconductor layer 106 is a thin film, the i-type microcrystalline semiconductor layer 106 can be formed with desired crystal grain diameters and a desired crystallization percentage to increase the photoelectromotive force and the photocurrent. At the microcrystalline volume percentage of less than 3% of the n-type microcrystalline semiconductor layer, the nucleation density becomes too small to sufficiently grow the crystals of the i-type microcrystalline semiconductor layer, whereas at the microcrystalline volume percentage higher than 75%, the nucleation density becomes excessively large to decrease the crystal grain diameters of the i-type microcrystalline semiconductor layer, thus increasing the crystal grain boundaries to lower the characteristics of the photovoltaic element.

The electric characteristics of the p-type semiconductor layer and the n-type semiconductor layer of the photovoltaic element are such that the activation energy is preferably not more than 0.2 eV, and more preferably not more than 0.1 eV. Further, the resistivity thereof is preferably not more than 100 Ωcm, and more preferably not more than 1 Ωcm. The thickness of the p-type semiconductor layer 107 is preferably 1–50 nm, and more preferably 3–10 nm.

In the present invention, the thickness of the n-type amorphous semiconductor layer 104 is preferably 50–1000 Å, and more preferably 100–700 Å. The thickness of less than 50 Å of n-type amorphous semiconductor layer 104 may render insufficient the reduction of the plasma damage of the first transparent conductive layer, lower the light reflectivity, and impair the adhesiveness of the layer. Further, the thickness of more than 1000 Å of the layer 104 may cause on increase of the series resistance of the photovoltaic element, and lowering of light reflectivity from the back surface, and increase of the microcrystalline volume percentage of the n-type microcrystalline semiconductor layer, thus lowering the characteristics of the photovoltaic element.

Further, in the present invention, the thickness of the n-type microcrystalline semiconductor layer 105 is preferably 50–1000 Å. The thickness of less than 50 Å of an n-type microcrystalline semiconductor layer 105 may impair the function of a nucleation layer for the i-type microcrystalline semiconductor layer to decrease the crystal grain diameter and the crystallization percentage of the i-type microcrystalline semiconductor layer 106. On the contrary, the thickness of more than 1000 Å of the layer 105 may cause an increase of the series resistance of the photovoltaic element and lowering of light reflectivity from the back surface, and may impair the uniformity of the crystal grain diameters of the n-type microcrystalline semiconductor layer 105 and cause abnormal growth of the i-type microcrystalline semiconductor layer 106, thus lowering the characteristics of the photovoltaic element.

(i-Type Microcrystalline Semiconductor Layer)

The i-type microcrystalline semiconductor layer 106 used for the pin junction is an important layer for generating carriers under light irradiation and transporting the carriers. As the i-type microcrystalline semiconductor layer 106, a layer having a slightly p-type nature or a slightly n-type nature may also be used.

In the present invention, as the semiconductor material for constituting the i-type microcrystalline semiconductor layer 106, microcrystalline silicon is used. The microcrystalline silicon is represented by $\mu$c-Si:H, $\mu$c-SiF, $\mu$c-Si:H:F, and so forth, according to the element compensating the dangling bonds.

As the i-type microcrystalline semiconductor layer 106 suitable for the present invention, there is included an i-type hydrogenated microcrystalline silicon ($\mu$c-Si:H) layer. The preferred characteristics thereof are an absorption coefficient ($\alpha$) of light (630 nm) of not less than 5000 cm$^{-1}$, a hydrogen atom content ($C_H$) of 1–10%, a photoconductivity ($\rho_p$) of not less than $1.0 \times 10^5$ S/cm under solar simulator irradiation of AM-1.5 and 100 mW/cm$^2$, a dark conductivity ($\rho_d$) of not more than $1.0 \times 10^{-6}$ S/cm, an Urbach energy of not more than 55 meV according to the constant photocurrent method (CPM), a preferential orientation in (110) direction of the X-ray diffraction peak, and crystal grain diameters of not more than 100 nm. For the i-type micro-crystalline semiconductor layer 106, the aforementioned microcrystalline materials for the p-type layer or the n-type layer can also be used in addition to the $\mu$c-Si:H.

In the present invention, the thickness of the i-type microcrystalline semiconductor layer 106 is preferably 0.5–3 $\mu$m. The thickness of less than 0.5 $\mu$m of i-type microcrystalline semiconductor layer 106 may render insufficient the crystal grain diameter and the crystallization percentage, tending to lower the short circuit current of the photovoltaic element. On the contrary, the thickness of more than 3 $\mu$m may accentuate the influence of a trace amount of defects or the states present in the crystal grain boundaries and in the microcrystals, thus lowering the short circuit current and the fill factor of the photovoltaic element. Further, in view of the running cost also, a smaller thickness of the i-type microcrystalline semiconductor layer is advantageous.

(Formation Process of Semiconductor Layer)

The semiconductor layer of the photovoltaic element of the present invention can be suitably formed by a plasma CVD employing a high frequency (VHF wave or microwave) in the range of 0.1–10 GHz. Another suitable process is a plasma CVD employing a high frequency (RF wave or VHF wave) in the range of 0.1 MHz to 0.1 GHz.

The plasma CVD process employing the high frequency in the range of 0.1–10 GHz can be conducted as described below. Material gases including a source gas, a dilution gas, and the like are introduced into a deposition chamber (a vacuum chamber) that can be evacuated. While the deposition chamber is exhausted with a vacuum pump, the internal pressure of the deposition chamber is kept constant. Into the deposition chamber, there is introduced a microwave or VHF wave (0.1–10 GHz) generated by a microwave power source or a VHF power source by a waveguide or a coaxial cable through a dielectric window (alumina ceramics or the like) or a conductor (a bar of Ni, W, SUS, or the like) insulated electrically from the deposition chamber. The source gas is decomposed by plasma generation to form a desired deposited film on a substrate placed in the deposition chamber. By this method, a deposition film applicable to a photovoltaic element can be formed under broad deposition conditions.

When depositing the semiconductor layer of the photovoltaic element of the present invention by use of the plasma CVD employing the high frequency of 0.1–10 GHz, the substrate temperature in the deposition chamber ranges preferably from 170 to 450° C., the internal pressure ranges preferably from 5 to 500 mTorr, and the microwave power or the VHF power ranges preferably from 0.001 to 1 W/cm$^3$.

Further, when depositing the semiconductor layer by use of the plasma CVD employing the high frequency of 0.1 MHz to 0.1 GHz, the substrate temperature in the deposition chamber ranges preferably from 100 to 350° C., the internal pressure ranges preferably from 0.1 to 10 Torr, the RF power or VHF power ranges preferably from 0.01 to 5.0 W/cm$^3$, and the deposition rate ranges preferably from 0.1 to 15 Å/sec.

As the deposition film formation system suitable for formation of the semiconductor layer of the photovoltaic element of the present invention, there can be used the roll-to-roll system disclosed in U.S. Pat. No. 4,400,409. In this deposition system, a plurality of glow discharge regions are arranged along a path through which a belt-like substrate is allowed to path successively, the belt-like substrate is delivered continuously in the longitudinal direction thereof while depositing and forming semiconductor layers of required conductivity types successively on the belt-like substrate in the respective glow discharge regions. Thereby, photovoltaic elements each having a desired semiconductor junction can be formed continuously.

(Second Transparent Conductive Layer)

In the present invention, in the case where light is incident upon the semiconductor layer from the side opposite to the support substrate 101 side, the second transparent conductive layer 108 is an electrode capable of transmitting the light at the light incidence side, and can also serve as an anti-reflection film by optimizing the film thickness thereof. The second transparent conductive layer 108 is required to have a high transmittance in the region of the wavelength absorbable by the semiconductor layer and to have a low resistivity. Specifically, the transmittance at 550 nm is preferably not less than 80%, more preferably not less than 85%. The resistivity is preferably not more than $5 \times 10^{-3}$ $\Omega$cm, more preferably not more than $1 \times 10^{-3}$ $\Omega$cm. The material therefor includes conductive oxides such as $In_2O_3$, $SnO_2$, ITO ($In_2O_3 + SnO_2$), ZnO, CdO, $Cd_2SnO_4$, $TiO_2$, $Ta_2O_5$, $Bi_2O_3$, $MoO_3$, $Na_xWO_3$, etc. and mixtures thereof. A dopant, which is an element to change conductivity, may be added to the above compounds.

As the element (dopant) for changing conductivity, there are preferably used Al, In, B, Ga, Si, F, etc. in the case where the second transparent conductive layer 108 is ZnO; Sn, F, Te, Ti, Sb, Pb, etc. in the case of $In_2O_3$; and F, Sb, P, As, In, Tl, Te, W, Cl, Br, I, etc. in the case of $SnO_2$.

Further, as the formation method of the second transparent conductive layer 108, there can preferably be used sputtering, especially sputtering employing a sputtering gas containing a trace amount of oxygen.

(Collector Electrode)

In the present invention, the collector electrode 109 is formed on a part of the second transparent electrode 108 as needed. It is formed when the second transparent electrode layer 108 is used as the light incidence side electrode, and when the resistivity of the layer cannot be sufficiently lowered. The collector electrode serves to lower the resistivity of the electrode to lower the series resistance of the photovoltaic element. The material therefor includes metals such as Au, Ag, Cu, Al, Ni, Fe, Cr, Mo, W, Ti, Co, Ta, Nb, Zr, etc., alloys such as stainless steel, etc., and a conductive paste using a powdery metal. The collector electrode is preferably formed in a branched shape not to intercept the light incident upon the semiconductor layer.

The percentage of the area of the collector electrode in the whole area of the light incidence side surface of the photovoltaic element is preferably not more than 15%, more preferably not more than 10%, still more preferably not more than 5%.

Further, the collector electrode can be formed in a pattern by use of a mask in vapor deposition, sputtering, or plating, or by printing, or by bonding a wire-like electrode.

When a photovoltaic device having a desired output voltage and a desired output current is comprises the photovoltaic elements of the present invention, it is preferred that the photovoltaic elements of the present invention are connected in series or in parallel; a protective layer is formed on each of the front and the back surfaces; and output electrodes or the like are attached. In the series connection of the photovoltaic elements of the present invention, a diode for preventing a reverse current is preferably incorporated.

EXAMPLE 1

In a first example of the present invention, on a support substrate 101, a back surface reflecting layer 102 and a first transparent conductive layer 103 were deposited by use of a deposition apparatus (not shown). Thereon, semiconductor layers were deposited by use of the deposition apparatus shown in FIG. 3 to make a photovoltaic element having the constitution shown in FIG. 1.

First, the substrate was prepared. A SUS 304 plate of 1.1 mm thick in a size of 50 mm×50 mm was subjected to ultrasonic cleaning with acetone and isopropanol, and dried with hot air. Next, Ag was deposited thereon at a room temperature in a thickness of 500 nm as the back surface reflecting layer 102 by use of a sputtering apparatus (not shown), and ZnO was then deposited at a substrate temperature of 200° C. in a thickness of 2 μm as the first transparent conductive layer 103 by use of the sputtering apparatus (not shown). The surface sectional shape of the first transparent conductive layer 103 was observed with a probe microscope. The results showed that at the sampling length dx ranging from 20 to 100 nm, the distribution of the inclinations, arctan (df/dx), was a normal distribution with the center at 0° and with the kurtosis ranging from −1.2 to 0.5, and that the standard deviation was 23°.

Figure 3:
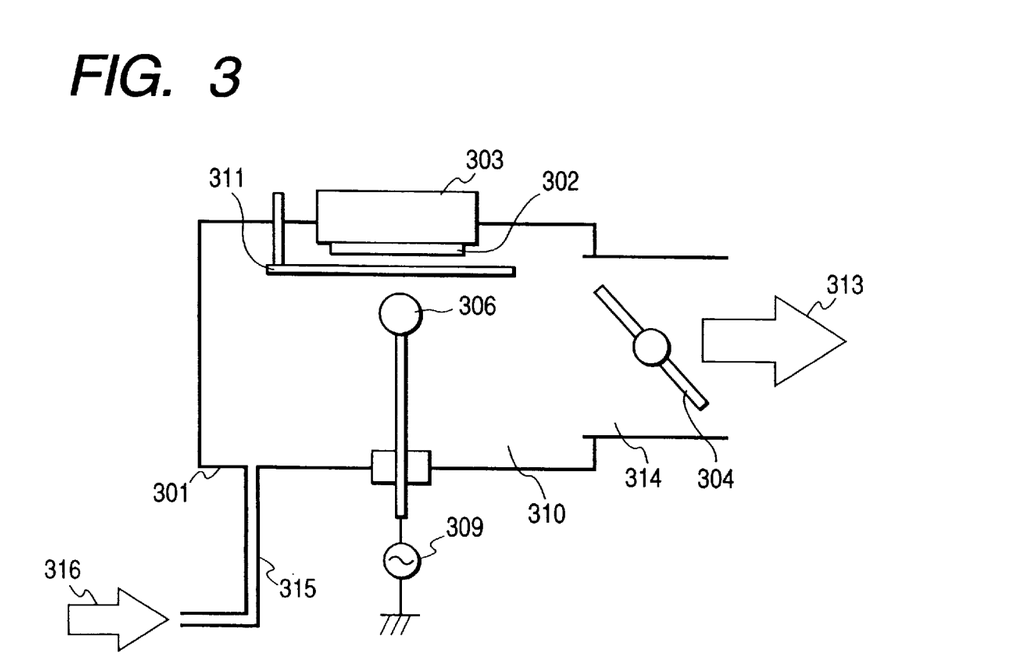
FIG. 3 is a schematic sectional view showing an example of a plasma CVD apparatus capable of forming the semiconductor layer of the photovoltaic element of the present invention.

FIG. 3 is a schematic sectional view showing an example of a plasma CVD apparatus capable of forming the semiconductor layer of the photovoltaic element of the present invention. In the FIG. 301 designates a reaction chamber (deposition chamber), 302 a substrate having formed thereon the respective layers up to the first transparent conductive layer, 303 a heater, 304 a conductance valve, 306 a high frequency introducing portion, 309 a high frequency power source having a matching circuit therein, 310 a plasma generation space, 311 a shutter for determining whether the substrate is exposed to a plasma generated in the plasma generation space, 314 an evacuation tube, and 315 a gas introduction tube. The arrow 313 indicates the direction of exhaustion, and the arrow 316 indicates the gas introduction direction. Although not shown in the figure, a vacuum pump is connected to the evacuation tube 314, and a source gas supplying apparatus is connected to the gas introduction tube 315. The plasma CVD apparatus comprises the above mentioned members and the like.

The source gas supplying apparatus (not shown) comprises source gas cylinders. Each source gas in the source gas cylinders is highly purified. In this example, the gas cylinders of $SiH_4$, $SiF_4$, $PH_3/H_2$ ($PH_3$ content: 1%), $B_2H_6/H_2$ ($B_2H_6$ content: 1%), and $H_2$ were connected to the gas introduction tube 315.

Using this plasma CVD apparatus, the semiconductor layers were formed by the following steps. First, the aforementioned substrate 302 on which the back surface reflecting layer and the first transparent conductive layer had been formed was attached onto the heater 303 in the reaction chamber 301. The reaction chamber 301 was evacuated to an internal pressure of $1 \times 10^{-5}$ Torr or lower by an oil diffusion pump (vacuum pump). When the inner pressure reached $1 \times 10^{-5}$ Torr or lower, $H_2$ gas (He gas may be used instead) was introduced through the gas introduction tube 315 into the reaction chamber 301, and the heater 303 was turned on to set the substrate 302 at a desired temperature.

When the temperature of the substrate 302 was stabilized, the source gases were introduced through the gas introduction tube 315 into the reaction chamber 301, and a power was introduced therein from the high frequency power source 309. When the plasma was generated in the plasma generation space, the conductance valve 304 was adjusted to attain the desired pressure while controlling the matching circuit to minimize the reflection power.

Then, the shutter 311 was opened to form the layer. When the layer was formed in a desired thickness, the shutter 311 was closed, the introduction of the high frequency power and the introduction of the source gases were stopped. Thereafter the next layer was prepared.

Using this apparatus in the manner described above, the n-type amorphous semiconductor layer 104, the n-type microcrystalline semiconductor layer 105, the i-type microcrystalline semiconductor layer 106, and the p-type semiconductor layer 107 were formed successively on the support substrate on which the back surface reflecting layer and the first transparent conductive layer had been formed. The n-type amorphous semiconductor layer 104 was formed by RF plasma CVD, and the n-type microcrystalline semiconductor layer 105 and the i-type microcrystalline semiconductor layer 106 were formed by VHF plasma, and the p-type semiconductor layer 107 was formed by RF plasma CVD.

The respective semiconductor layers were formed as described below in detail.

(Formation of N-type Amorphous Semiconductor layer)

$H_2$ gas was introduced at 300 sccm into the deposition chamber 301. When the internal pressure of the deposition chamber 301 was stabilized at 1.1 Torr and the temperature of the substrate 302 was stabilized at 250° C., $SiH_4$ gas at 4 sccm, $PH_3/H_2$ gas at 2 sccm, and $H_2$ gas at 100 sccm were introduced into the deposition chamber 301 with the internal pressure of the deposition chamber 301 controlled so as to be 1.1 Torr. As the high frequency power source 309, an RF power source of 13.56 MHz was used. The power of the RF power source (13.56 MHz) 309 was set at 5 W; the RF power was applied to the RF electrode (high frequency introducing portion) 306 to generate a plasma; the shutter 311 was opened to start formation of the n-type amorphous semiconductor layer 104 on the ZnO layer 103. When the layer 104 had grown to a thickness of 15 nm, the shutter 311 was closed, and the RF power source 309 was turned off to stop the plasma and to finish the formation of the n-type amorphous semiconductor layer 104. The introduction of $SiH_4$ gas and $PH_3/H_2$ gas into the deposition chamber 301 was stopped, and the introduction of $H_2$ gas into the deposition chamber 301 was continued for another 2 minutes. Thereafter, the introduction of $H_2$ gas was stopped, and the deposition chamber 301 and the gas tubes 314, 315 were evacuated to $1 \times 10^{-5}$ Torr.

(Formation of N-type Microcrystalline Semiconductor Layer)

Subsequently, $H_2$ gas was introduced at 300 sccm into the deposition chamber 301. When the internal pressure of the deposition chamber 301 was stabilized at 0.4 Torr and the temperature of the substrate 302 was stabilized at 250° C., $SiH_4$ gas at 0.4 sccm, $PH_3/H_2$ gas at 1 sccm, and $H_2$ gas at 100 sccm were introduced into the deposition chamber 301 with the internal pressure of the deposition chamber 301 controlled so as to be 0.4 Torr. As the high frequency power source 309, a VHF power source of 105 MHz was used. The power of the VHF power source (105 MHz) 309 was set at 5 W; the power of the VHF power source 309 was applied to the VHF electrode (high frequency introducing portion) 306 to generate plasma; the shutter 311 was opened to start formation of the n-type microcrystalline semiconductor layer 105 on the n-type amorphous semiconductor layer 104. When the layer 105 had grown to a thickness of 15 nm, the shutter 311 was closed, and the VHF power source 309 was turned off to stop the plasma and to finish the formation of the n-type microcrystalline semiconductor layer 105. The introduction of $SiH_4$ gas and $PH_3/H_2$ gas into the deposition chamber 301 was stopped, and the introduction of $H_2$ gas into the deposition chamber 301 was continued for another 2 minutes. Thereafter, the introduction of $H_2$ gas was stopped, and the deposition chamber 301 and the gas tubes 314, 315 were evacuated to $1 \times 10^{-5}$ Torr.

(Formation of I-type Microcrystalline Semiconductor Layer)

Subsequently, $H_2$ gas was introduced at 500 sccm into the deposition chamber 301. When the internal pressure of the deposition chamber 301 was stabilized at 0.3 Torr and the temperature of the substrate 302 was stabilized at 200° C., $SiH_4$ gas at 25 sccm and $H_2$ gas at 750 sccm were introduced into the deposition chamber 301 with the internal pressure of the deposition chamber 301 controlled so as to be 0.3 Torr. As the high frequency power source 309, a VHF power source of 105 MHz was used. The power of the VHF power source (105 MHz) 309 was set at 6 W; the power of the VHF power source 309 was applied to the VHF electrode (high frequency introducing portion) 306 to generate plasma; the shutter 311 was opened to start formation of the i-type microcrystalline semiconductor layer 106 on the n-type microcrystalline semiconductor layer 105. When the layer 106 had grown to a thickness of 1.2 nm, the shutter 311 was closed, and the VHF power source 309 was turned off to stop the plasma and to finish the formation of the i-type microcrystalline semiconductor layer 106. The introduction of $SiH_4$ gas into the deposition chamber 301 was stopped, and the introduction of $H_2$ gas into the deposition chamber 301 was continued for another minute. Thereafter, the introduction of $H_2$ gas was stopped, and the deposition chamber 301 and the gas tubes 314, 315 were evacuated to $1 \times 10{-5}$ Torr.

(Formation of P-type Semiconductor Layer)

Subsequently, $H_2$ gas was introduced at 500 sccm into the deposition chamber 301, and the internal pressure of the deposition chamber 301 was set at 1.8 Torr and the temperature of the substrate 302 was set at 180° C. When the temperature of the substrate became stable, $SiH_4$ gas, $H_2$ gas and $BF_3/H_2$ gas were introduced into the deposition chamber 301. At this time, the $SiH_4$ gas flow rate was 0.02 sccm, the $H_2$ gas flow rate was 50 sccm, the $BF_3/H_2$ gas flow rate was 2 sccm, and the pressure was 1.8 Torr. As the high frequency power source 309, an RF power source of 13.56 MHz was used. The power of the RF power source (13.56 MHz) 309 was set at 40 W to generate a plasma; the shutter 311 was opened to start formation of the p-type semiconductor layer 107 on the i-type microcrystalline semiconductor layer 106. When the layer 107 had grown to a thickness of 7 nm, the shutter 311 was closed, and the RF power source 309 was turned off to stop the plasma and to finish the formation of the p-type semiconductor layer 107. The introduction of $SiH_4$ gas and $BF_3/H_2$ gas into the deposition chamber 301 was stopped, and the introduction of $H_2$ gas into the deposition chamber 301 was continued for another 2 minutes. Thereafter, the introduction of $H_2$ gas was stopped, and the deposition chamber 301 and the gas tubes 314, 315 were evacuated to $1 \times 10^{-5}$ Torr to leak the deposition chamber 301.

Next, on the p-type semiconductor layer 107, an ITO (indium-tin oxide) layer was deposited as the second transparent conductive layer 108. The ITO layer 108 was deposited in a thickness of 70 nm by use of a sputtering apparatus (not shown) with ITO ($In_2O_3+SnO_2$: 10%) used as the target, by introducing $Ar/O_2$ at the flow rates of 30 sccm/0.1 sccm as the sputtering gas, and applying a power of 200 W from a DC power source while heating the substrate to 200° C.

On the formed second transparent conductive layer 108, a comb-shaped collector electrode 109 comprised of Cr (40 nm)/Ag (1000 nm)/Cr (40 nm) was vapor deposited by the electron beam vacuum vapor deposition with a mask having a comb-shaped opening placed on the layer 108.

The photovoltaic element of the present example was made in the manner described above. The microcrystalline volume percentage of the n-type microcrystalline semiconductor layer of the present example was determined to be 45% by the X-ray diffraction.

Comparative Example 1

A photovoltaic element was prepared in the same manner as in Example 1 except that the n-type amorphous semiconductor layer 104 of Example 1 was not deposited.

Comparative Example 2

A photovoltaic element was prepared in the same manner as in Example 1 except that the n-type microcrystalline semiconductor layer 105 of Example 1 was not deposited.

The photovoltaic elements of Example 1 and Comparative Examples 1 and 2 were each subjected to an initial photoelectric conversion efficiency (photoelectromotive force/incident light power) measurement, photodeterioration test, and vibrational deterioration test according to the methods as described below.

Initial Photoelectric Conversion Efficiency Measurement: The initial photoelectric conversion efficiency was determined by placing the photovoltaic element under light irradiation of AM-1.5 (100 mW/cm$^2$) and measuring the V-I characteristics.

Photodeterioration Test: The photovoltaic element was preliminarily subjected to measurement of the initial photoelectric conversion efficiency. Then, the photovoltaic element was placed in an atmosphere of a relative humidity 50% and a temperature 25° C. and was irradiated with AM-1.5 light for 800 hours. Thereafter, the ratio of the photoelectric conversion efficiency under AM-1.5 light irradiation to that of the initial photoelectric conversion efficiency (photoelectric conversion efficiency after photodeterioration test/initial photoelectric conversion efficiency) was determined.

Vibrational Deterioration Test: The photovoltaic element was preliminarily subjected to a measurement of the initial photoelectric conversion efficiency. Then, the photovoltaic element was set in a dark place with a relative humidity of 50% and a temperature of 25° C. and was subjected to a vibration of an oscillation frequency of 60 Hz and an amplitude of 0.1 mm for 500 hours. Thereafter, the ratio of the photoelectric conversion efficiency under AM-1.5 light irradiation to that of and the initial photoelectric conversion efficiency (photoelectric conversion efficiency after vibrational deterioration test/initial photoelectric conversion efficiency) was determined.

Table 1 shows the relative values of the respective measured data of the photovoltaic elements of Example 1 and Comparative Examples 1 and 2 (the initial photoelectric conversion coefficiency, the ratios after the photodeterioration and after the vibrational deterioration in Example 1 being taken as 1 respectively).

Table 1 shows clearly that the photovoltaic element of the present invention has excellent initial photoelectric conversion efficiency, photoelectric conversion efficiency after photodeterioration, and photoelectric conversion efficiency after vibrational deterioration.

EXAMPLE 2

Figure 4:
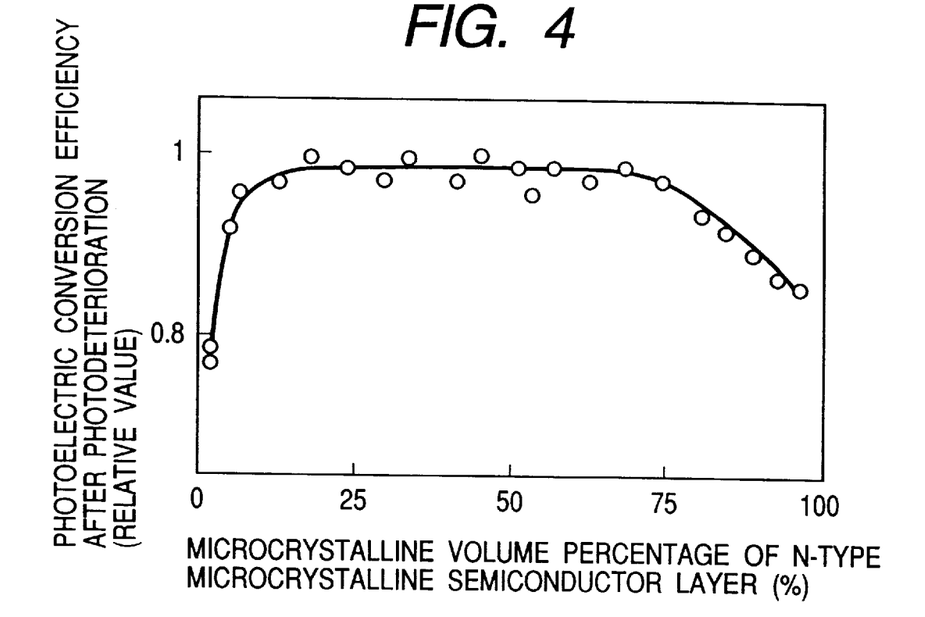
FIG. 4 is a graph showing the relation between the microcrystalline volume percentage of the n-type microcrystalline semiconductor layer and the photoelectric conversion efficiency (relative value) after photodeterioration in Example 2 of the present invention.

Photovoltaic elements were prepared in the same manner as in Example 1 except that the microcrystalline volume percentage of the n-type microcrystalline semiconductor layer 105 was varied. The photovoltaic elements were subjected to the photodeterioration test in the same manner as in Example 1. FIG. 4 shows the dependence of the photoelectric conversion efficiency after photodeterioration (values relative to the photoelectric conversion efficiency after the photodeterioration in Example 1 taken as 1, the same applying to the following Examples) on the microcrystalline volume percentage of the n-type microcrystalline semiconductor layer.

FIG. 4 shows that the microcrystalline volume percentage of the n-type microcrystalline semiconductor layer 105 is preferably in the range from 3 to 75%.

EXAMPLE 3

Figure 5:
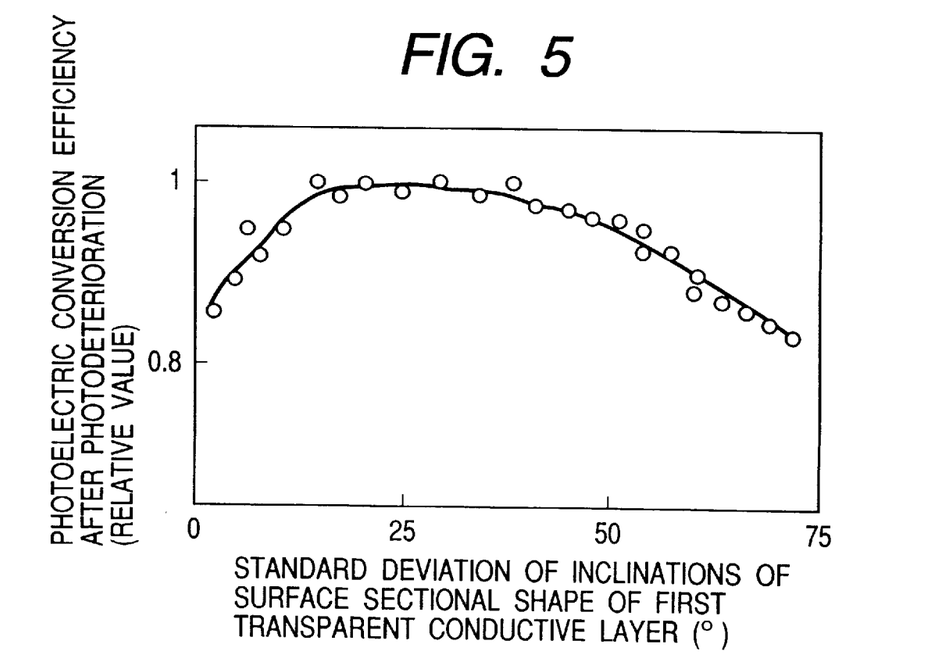
FIG. 5 is a graph showing the relation between the inclinations of the surface sectional shape of the first transparent conductive layer and the photoelectric conversion efficiency (relative value) after photodeterioration in Example 3 of the present invention.
Figure 6:
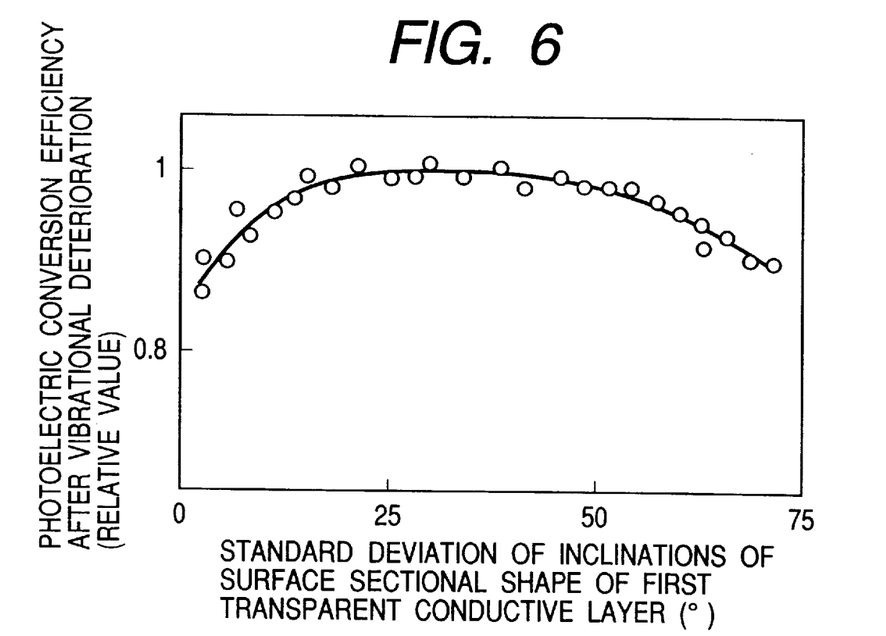
FIG. 6 is a graph showing the relation between the inclinations of the surface sectional shape of the first transparent conductive layer and the photoelectric conversion efficiency (relative value) after vibrational deterioration in Example 3 of the present invention.

Photovoltaic elements were prepared in the same manner as in Example 1 except that the inclinations of the surface sectional shape were varied by changing the forming conditions (Table 2) of the back surface reflecting layer (Ag) 102 and the first transparent conductive layer (ZnO) 103 and by changing the conditions (Table 3) of the wet etching of the surface of the first transparent conductive layer 103 with an aqueous acetic acid solution. FIG. 5 and FIG. 6 show the dependence of the photoelectric conversion efficiency (relative value) after the photodeterioration and that after vibrational deterioration on the inclinations of the surface sectional shape of the first transparent conductive layer 103. The results are shown by the values relative to the photoelectric conversion efficiency after the vibrational deterioration in Example 1 taken as 1.

FIGS. 5 and 6 show that the standard deviation of the inclinations of the surface sectional shape of the first transparent conductive layer 103 is preferably in the range from 15° to 55°.

EXAMPLE 4

Figure 7:
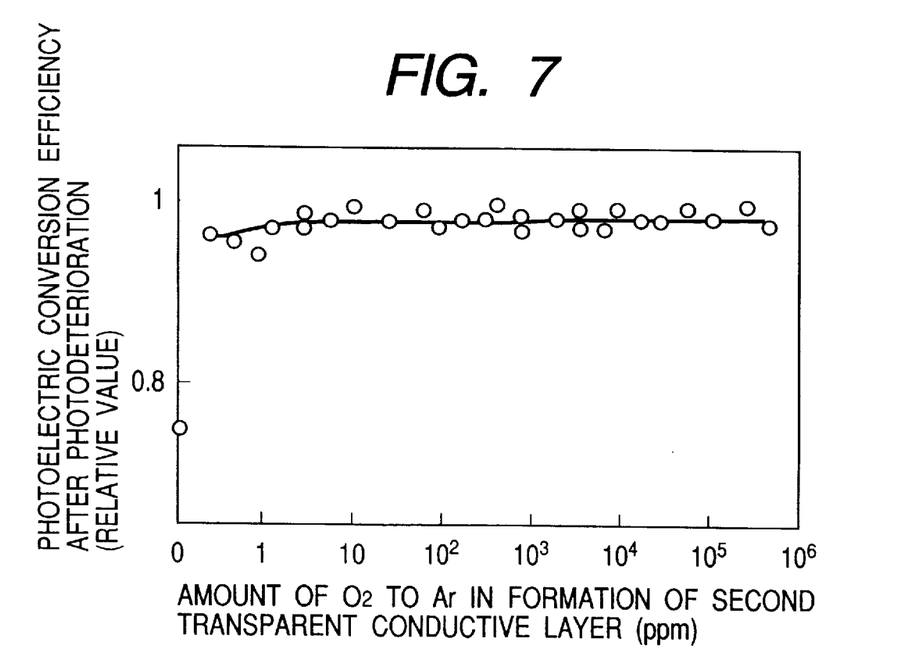
FIG. 7 is a graph showing the relation between the $O_2$ content to Ar in the sputtering gas composition used during the sputtering film formation of the second transparent conductive layer and the photoelectric conversion efficiency (relative value) after photodeterioration in Example 4 of the present invention.

Photovoltaic elements were prepared and evaluated in the same manner as in Example 1 except that the oxygen content in the sputtering gas in formation of the second transparent conductive layer 108 was varied. FIG. 7 shows the results.

FIG. 7 shows that it is preferable to form the second transparent conductive layer 108 by sputtering in a sputtering gas containing a trace amount of oxygen in the preparation of the photovoltaic element of the present invention.

EXAMPLE 5

Figure 8:
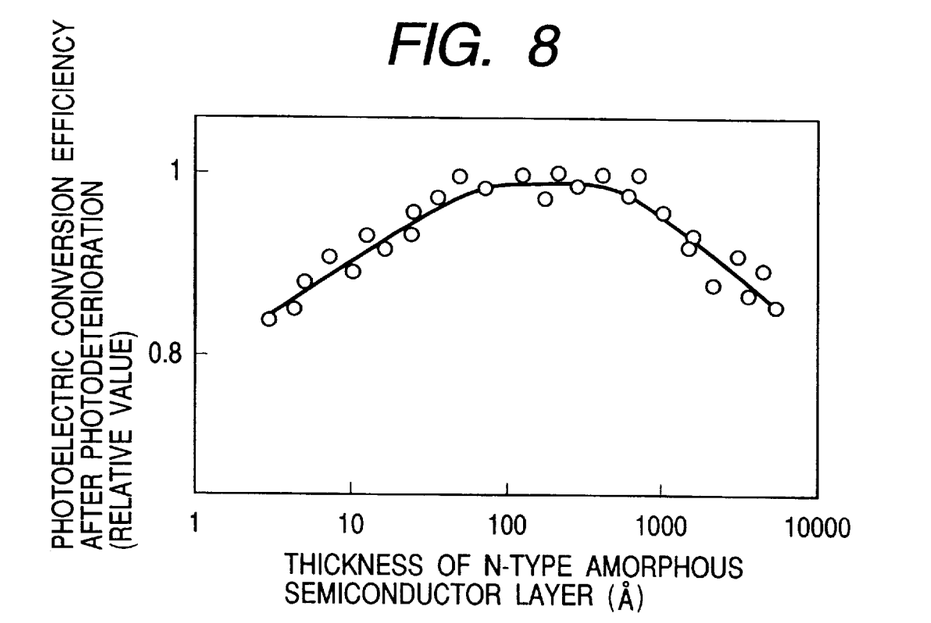
FIG. 8 is a graph showing the relation between the thickness of the n-type amorphous semiconductor layer and the photoelectric conversion efficiency (relative value) after photodeterioration in Example 5 of the present invention.
Figure 9:
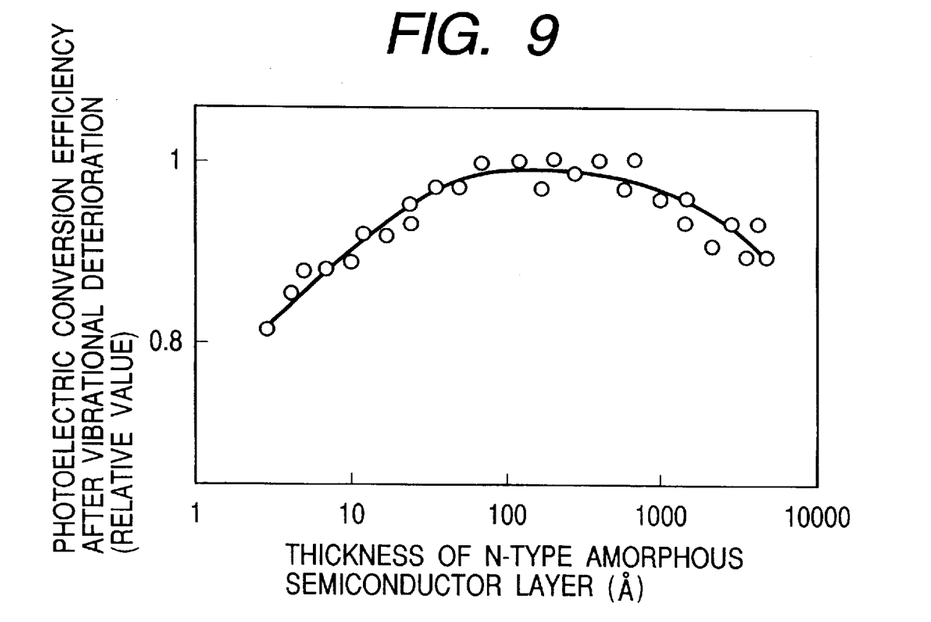
FIG. 9 is a graph showing the relation between the thickness of the n-type amorphous semiconductor layer and the photoelectric conversion efficiency (relative value) after vibrational deterioration in Example 5 of the present invention.

Photovoltaic elements were prepared and evaluated in the same manner as in Example 1 except that the thickness of the n-type amorphous semiconductor layer 104 was varied. FIGS. 8 and 9 show the results.

FIGS. 8 and 9 show that the thickness of the n-type amorphous semiconductor layer 104 of the photovoltaic element is preferably in the range from 50 to 1000 Å in the present invention.

EXAMPLE 6

Figure 10:
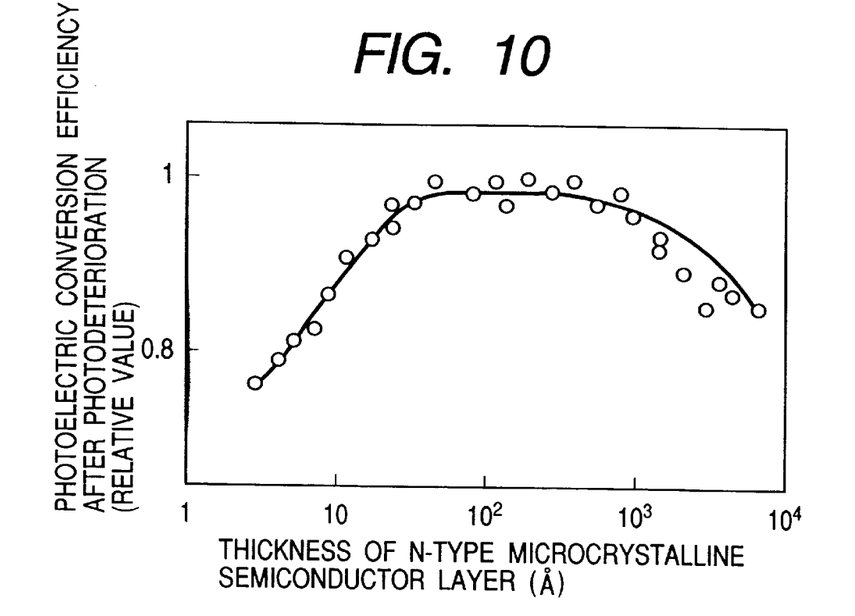
FIG. 10 is a graph showing the relation between the thickness of the n-type microcrystalline semiconductor layer and the photoelectric conversion efficiency (relative value) after photodeterioration in Example 6 of the present invention.
Figure 11:
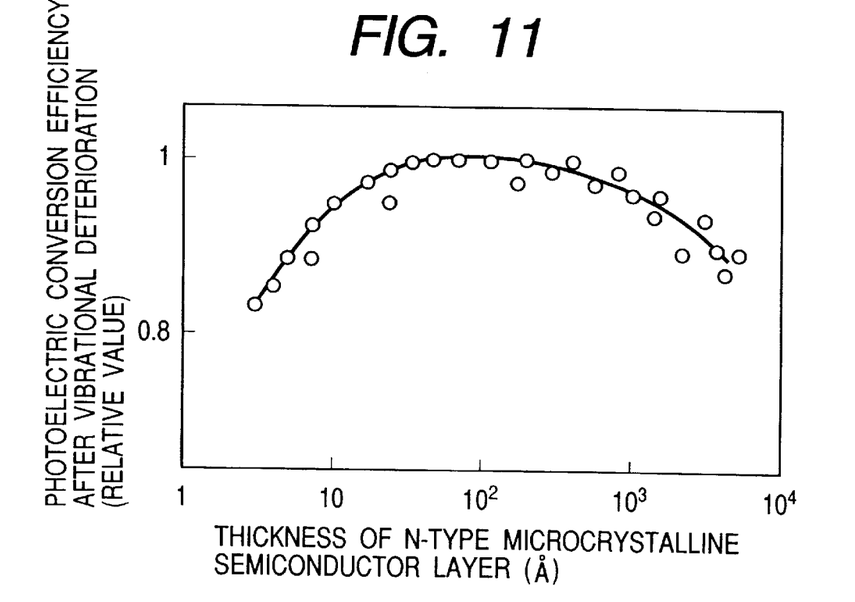
FIG. 11 is a graph showing the relation between the thickness of the n-type microcrystalline semiconductor layer and the photoelectric conversion efficiency (relative value) after vibrational deterioration in Example 7 of the present invention.

Photovoltaic elements were prepared and evaluated in the same manner as in Example 1 except that the thickness of the n-type microcrystalline semiconductor layer 105 was varied. FIGS. 10 and 11 show the results.

FIGS. 10 and 11 show that the thickness of the n-type microcrystalline semiconductor layer 105 of the photovoltaic element is preferably in the range from 50 to 1000 Å in the present invention.

EXAMPLE 7

Figure 12:
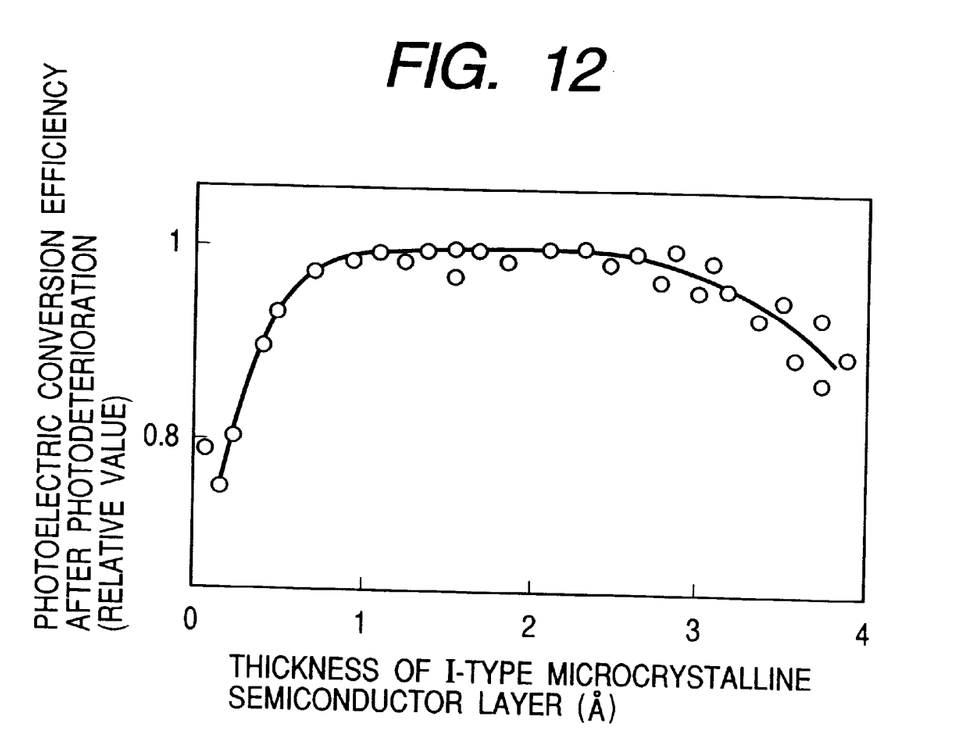
FIG. 12 is a graph showing the relation between the thickness of the i-type microcrystalline semiconductor layer and the photoelectric conversion efficiency (relative value) after photodeterioration in Example 8 of the present invention.

Photovoltaic elements were prepared and evaluated in the same manner as in Example 1 except that the thickness of the i-type microcrystalline semiconductor layer 106 was varied. FIG. 12 shows the results.

FIG. 12 shows that the thickness of the i-type microcrystalline semiconductor layer 106 of the photovoltaic element is preferably in the range from 0.5 to 3 μm in the present invention.

As described above, in the present invention, the photovoltaic element can be formed using thin film microcrystalline layers at a high deposition rate with improved layer adhesion, short circuit current, open circuit current, and fill factor, thereby also improving the photoelectric conversion efficiency. Furthermore, the photovoltaic element can be provided that has an improved resistance to photodeterioration and vibrational deterioration and an excellent durability.

TABLE 1

|  | Initial conversion efficiency | Rate in photo-deterioration test | Rate in vibrational deterioration test | Overall Evaluation |
|---|---|---|---|---|
| Example 1 | 1 | 1 | 1 | Excellent |
| Comparative Example 1 | 0.87 | 0.9 | 0.87 | Poor |
| Comparative Example 2 | 0.93 | 0.75 | 0.9 | Poor |

TABLE 2

|  | Ag | ZnO |
|---|---|---|
| Substrate temperature | RT–350° C. | 150–400° C. |
| Deposition pressure | 5–30 mTorr | 5–30 mTorr |
| Introduced power | 100–400 W | 100–400 W |

(RT: Room temperature)

TABLE 3

|  | Liquid temperature (° C.) | Immersion time (sec) |
|---|---|---|
| 5% Aqueous acetic acid solution | 15–40 | 5–120 |
| 10% Aqueous acetic acid solution | 15–35 | 5–90 |

What is claimed is:

1. A photovoltaic element comprising a conductive substrate having on a support substrate at least one layer of a first transparent conductive layer; an n-type semiconductor layer, an i-type semiconductor layer, and a p-type semiconductor layer provided on the conductive substrate substrate in the order mentioned; and a second transparent conductive layer further provided thereon, wherein the n-type semiconductor layer comprises at least two layers of an n-type amorphous semiconductor layers and an n-type microcrystalline semiconductor layer of a microcrystalline volume percentage of 3–75% in the order mentioned, and wherein the i-type semiconductor layer comprises an i-type microcrystalline semiconductor layer.

2. The photovoltaic element according to claim 1, wherein the first transparent conductive layer has a surface at the semiconductor layer side thereof such that where f represents the distance from the support substrate surface to the layer surface, within the range of 20 to 100 nm of the sampling length dx, the distribution of inclinations, arctan (df/dx) of the layer surface is a normal distribution with 0° being the center, and that the kurtosis is within the range of −1.2 to 0.5 and the standard deviation is 15° to 55°.

3. The photovoltaic element according to claim 1, wherein the second transparent conductive layer is formed by sputtering using a sputtering gas containing a trace amount of oxygen.

4. The photovoltaic element according to claim 1, wherein the n-type amorphous semiconductor layer has a thickness of 50–1000 Å.

5. The photovoltaic element according to claim 1, wherein the n-type microcrystalline semiconductor layer has a thickness of 50–1000 Å.

6. The photovoltaic element according to claim 1, wherein the i-type microcrystalline semiconductor layer has a thickness of 0.5–3 $\mu$m.

* * * * *

UNITED STATES PATENT AND TRADEMARK OFFICE
CERTIFICATE OF CORRECTION

PATENT NO. : 6,211,454 B1
DATED : April 3, 2001
INVENTOR(S) : Masafumi Sano

It is certified that error appears in the above-identified patent and that said Letters Patent is hereby corrected as shown below:

<u>Title page,</u>
Insert -- Item [74] *Attorney, Agent, or Firm*-Fitzpatrick, Cella, Harper & Scinto --.

<u>Column 1,</u>
Line 21, "junction and" should read -- junction. --; and
Line 22, "are unmoved." should be deleted.

<u>Column 4,</u>
Line 5, "scheme" should read -- schematic --.

<u>Column 8,</u>
Line 40, "is relatively" should read -- distribution is relatively --; and
Line 43, "a" should be deleted; and "distribution" (second occurrence) should be deleted.

<u>Column 9,</u>
Line 23, ""pc-"" should read -- "$\mu$c-" --.

<u>Column 13,</u>
Line 8, "is" should be deleted; and
Line 58, "the" should read -- to the --.

<u>Column 16,</u>
Line 66, "to that of" should be deleted.

Signed and Sealed this

Fourteenth Day of May, 2002

*Attest:*

*Attesting Officer*

JAMES E. ROGAN
*Director of the United States Patent and Trademark Office*